United States Patent
Hsieh et al.

(10) Patent No.: US 8,323,877 B2
(45) Date of Patent: Dec. 4, 2012

(54) PATTERNING METHOD AND METHOD FOR FABRICATING DUAL DAMASCENE OPENING

(75) Inventors: Ming-Da Hsieh, Kaohsiung (TW); Yu-Tsung Lai, Taichung County (TW); Jiunn-Hsiung Liao, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 148 days.

(21) Appl. No.: 12/947,139

(22) Filed: Nov. 16, 2010

(65) Prior Publication Data

US 2012/0122035 A1    May 17, 2012

(51) Int. Cl.
  *G03F 7/26* (2006.01)
(52) U.S. Cl. ............................................ 430/313
(58) Field of Classification Search .................. 430/323; 216/58, 62, 72
  See application file for complete search history.

(56) References Cited

U.S. PATENT DOCUMENTS

| | | | |
|---|---|---|---|
| 6,720,132 B2 | 4/2004 | Tsai et al. | |
| 7,067,235 B2 | 6/2006 | Tsai et al. | |
| 2002/0182874 A1* | 12/2002 | Wang | 438/706 |
| 2004/0209469 A1* | 10/2004 | Harada et al. | 438/689 |
| 2008/0102643 A1 | 5/2008 | Chen et al. | |
| 2009/0258499 A1 | 10/2009 | Huang et al. | |
| 2011/0130008 A1 | 6/2011 | Hsieh et al. | |

* cited by examiner

*Primary Examiner* — Kathleen Duda
*Assistant Examiner* — Caleen Sullivan
(74) *Attorney, Agent, or Firm* — J.C. Patents

(57) ABSTRACT

A patterning method and a method for fabricating a dual damascene opening are described, wherein the patterning method includes following steps. An organic layer, a silicon-containing mask layer and a patterned photoresist layer are formed on a material layer in sequence. The silicon-containing mask layer is removed using the patterned photoresist layer as a mask. A reactive gas is used for conducting an etching step so as to remove the organic layer with the silicon-containing mask layer as a mask, wherein the reactive gas contains no oxygen species. The material layer is removed using the organic layer as a mask, so that an opening is formed in the material layer. The organic layer is then removed.

10 Claims, 6 Drawing Sheets

PATTERNING METHOD AND METHOD FOR FABRICATING DUAL DAMASCENE OPENING

BACKGROUND OF THE INVENTION

1. Field of the Invention

The present invention relates to a semiconductor process, and more particularly, to a patterning method and a method for fabricating a dual damascene opening.

2. Description of Related Art

Along with rapid progress of semiconductor technology, the dimensions of semiconductor devices are reduced and the integrity thereof promoted continuously to further advance the operating speed and performance of integrated circuits (ICs). In general, as the semiconductor devices develop towards the design of the compact circuits, the lithography process plays a significant role in the entire process. In the semiconductor process, for the patterning of each film or areas with implanted dopant, the scope thereof is defined and the critical dimension (CD) is determined by the lithography process. Patterns are generally formed in a photoresist layer through the lithography process. A dry etching process or a wet etching process is then performed with the photoresist layer employed as an etching mask, so that the patterns in the photoresist layer are transferred to a layer to be patterned thereunder.

As the devices are continuously miniaturized and integrated, the design of the ICs becomes increasingly complicated, such that accuracy of the pattern transferring is quite important. The CD of the patterns is gradually reduced, and thereby the lithographic process requires high resolution correspondingly. To meet the requirement of high resolution, the thickness of the photoresist layer has to be thinned down. During the subsequent etching process, the photoresist layer with insufficient thickness as an etching mask, however, is very likely to be consumed thoroughly before the patterns are completely transferred to the underlying layer to be patterned, so that the desired patterning function cannot be accomplished.

Moreover, as the demand for the device integrity is raised, dramatic changes in physical properties have to be considered so as to avoid a great impact on the operating speed and performance of the devices. As shown in FIG. 1, taking a pattern transferring with use of a patterned photoresist layer (not shown) as an example, openings 104 are formed in a layer 102 to be patterned which is on a substrate 100. After performing an etching process, the openings 104 may suffer from excessively large top CD if the patterns of the adjacent openings 104 are too close. When a conductive layer 106 is deposited in the openings 104, the conductive structures formed in the adjacent openings 104 are prone to bridging 108 therebetween, which may seriously impact the subsequent process and product reliability. In addition, the opening patterns of the patterned photoresist layer tend to form bowing profiles, each of which has a wider center and a narrower top and bottom, due to over side etching of the patterned photoresist layer. Accordingly, after the patterns of the patterned photoresist layer are transferred to the layer 102 to be patterned, the openings 104 formed in the layer 102 to be patterned are easily obtained with the bowing profiles 110.

As a result, how to meet the purpose of improvement in the bridging and bowing profile defects of the openings is one of the immediate issues to be solved in the art as CD of the patterns is miniaturized, so as to ensure the device reliability and yield in the subsequent process.

SUMMARY OF THE INVENTION

Accordingly, the present invention is directed to a patterning method, so as to ensure accuracy of the pattern transferring.

The present invention is also directed to a method for fabricating a dual damascene opening, and thereby the opening is formed with a smoother profile.

A patterning method of the present invention is described as follows. An organic layer, a silicon-containing mask layer and a patterned photoresist layer are formed on a material layer in sequence. The silicon-containing mask layer is removed using the patterned photoresist layer as a mask. A reactive gas is used for conducting an etching step so as to remove the organic layer with the silicon-containing mask layer as a mask, wherein the reactive gas contains no oxygen species. The material layer is removed using the organic layer as a mask, so that an opening is formed in the material layer. The organic layer is then removed.

According to an embodiment of the present invention, in the patterning method, the reactive gas includes $N_2$ and $H_2$.

According to an embodiment of the present invention, in the patterning method, the reactive gas consists of $N_2$ and $H_2$.

According to an embodiment of the present invention, in the patterning method, a volumetric flow rate ratio of $N_2$ to $H_2$ ranges between 3:1 and 1:1.

According to an embodiment of the present invention, in the patterning method, a duration of the etching step ranges between 50 seconds and 150 seconds.

According to an embodiment of the present invention, in the patterning method, the organic layer includes I-line photoresist.

According to an embodiment of the present invention, in the patterning method, the opening includes a dual damascene opening, a contact hole, a via hole, or a conductive line opening.

Another patterning method of the present invention is described as follows. An organic layer, a silicon-containing mask layer and a patterned photoresist layer are formed on a material layer in sequence. The silicon-containing mask layer is removed using the patterned photoresist layer as a mask. A reactive gas is used for conducting an etching step so as to remove the organic layer with the silicon-containing mask layer as a mask, wherein the reactive gas provides a reactive species, and a bond energy of a chemical bond formed between the reactive species and a species in the organic layer is weaker than C=O bond energy or C≡O bond energy. The material layer is removed using the organic layer as a mask, so that an opening is formed in the material layer. The organic layer is then removed.

According to an embodiment of the present invention, in the patterning method, the bond energy of a single bond or a double bond formed between the reactive species and the species in the organic layer is weaker than C=O bond energy, and the bond energy of a triple bond formed between the reactive species and the species in the organic layer is weaker than C≡O bond energy.

A method for fabricating a dual damascene opening of the present invention is also described as follows. A substrate is provided, and the substrate has at least one conductive region covered by a liner. A dielectric layer and a patterned hard mask layer are formed on the liner in sequence, wherein the patterned hard mask layer has an opening exposing the dielectric layer. A tri-layer structure filling the opening is formed on the patterned hard mask layer, wherein the tri-layer structure includes an organic layer, a silicon-containing mask layer and a patterned photoresist layer stacked in a bottom-up manner. The silicon-containing mask layer is removed using the patterned photoresist layer as a mask. A reactive gas is used for conducting an etching step so as to remove the organic layer with the silicon-containing mask layer as a mask, wherein the reactive gas contains no oxygen species. The dielectric layer is removed using the silicon-containing mask layer and the organic layer as a mask, so that a via hole exposing the liner is formed in the dielectric layer. The organic layer is removed. The dielectric layer is removed using the patterned hard mask layer as a mask to form a trench in the dielectric layer, and the liner exposed by the via hole is removed to expose the conductive region, wherein the trench is connected with the via hole.

According to an embodiment of the present invention, in the patterning method, the reactive gas includes $N_2$ and $H_2$.

According to an embodiment of the present invention, in the patterning method, the reactive gas consists of $N_2$ and $H_2$.

According to an embodiment of the present invention, in the patterning method, a volumetric flow rate ratio of $N_2$ to $H_2$ ranges between 3:1 and 1:1.

According to an embodiment of the present invention, in the patterning method, a duration of the etching step ranges between 50 seconds and 150 seconds.

According to an embodiment of the present invention, in the patterning method, the organic layer includes I-line photoresist.

As mentioned above, in the patterning method of the present invention, the organic layer is etched by using the reactive gas without the oxygen species, or the reactive gas capable of forming a chemical bond with less bond energy between the reactive species and the species in the organic layer. Accordingly, the patterning method of the present invention can perform a re-deposition process during the etching of the organic layer, thereby maintaining the predetermined shape and CD of the pattern transferred to the organic layer.

Furthermore, the method for fabricating the dual damascene opening in the patterning method includes utilizing the organic layer with a smoother profile and the predetermined CD as a mask, so as to pattern the dielectric layer and form the via hole in the dielectric layer. Hence, top CD of the resultant opening can be shrunk down, the profile of the opening can be improved effectively.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
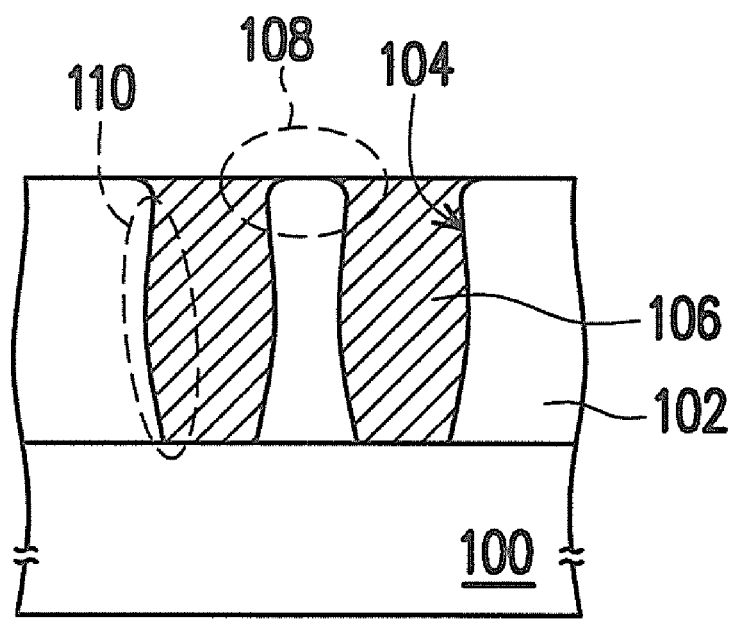
FIG. 1 is a cross-sectional diagram schematically illustrating openings formed in a conventional method with excessively large top CD and bowing profiles.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
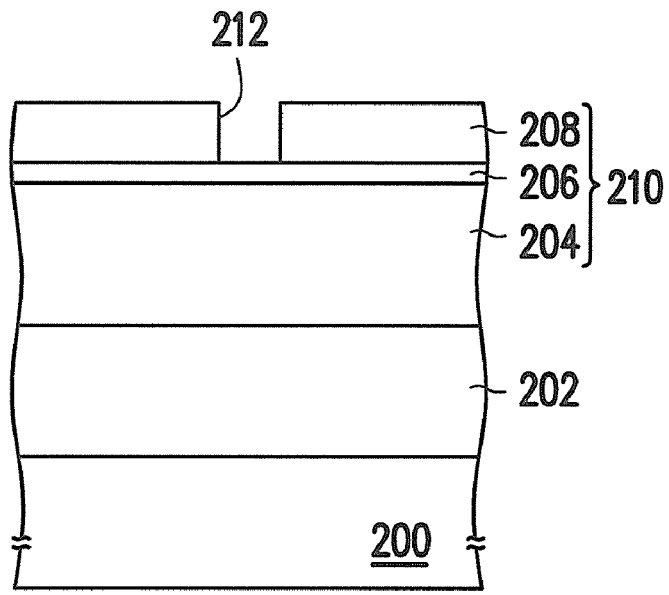
FIGS. 2A-2D depict, in a cross-sectional view, a patterning method according to an embodiment of the present invention.

FIGS. 2A-2D depict, in a cross-sectional view, a patterning method according to an embodiment of the present invention. Referring to FIG. 2A, a substrate 200 is provided. A material layer 202, in which patterns are to be formed, is formed on the substrate 200. An organic layer 204, a silicon-containing mask layer 206 and a patterned photoresist layer 208 are formed on the material layer 202 in sequence. The material of the organic layer 204 includes I-line photoresist with a wavelength of 365 nm and so on. The silicon-containing mask layer 206 is, for example, a silicon-containing hard-mask bottom anti-reflection coating (SHB), of which the material may include organosilicon polymer or polysilane utilized for bottom anti-reflection coating (BARC). The patterned photoresist layer 208, for example, has an opening pattern 212, and the formation thereof can be carried out by an exposure step and a successive development step, that is, an ordinary well-known lithography process. The material of the patterned photoresist layer 208 can be an ordinary photoresist material utilized for the lithography process, such as ArF photoresist with a wavelength of 193 nm, which may be acrylate-type photoresist, cycloolefin-type photoresist, COMA-type photoresist, or VEMA-type photoresist.

The above-mentioned organic layer 204, the silicon-containing mask layer 206 and the patterned photoresist layer 208, for example, form a tri-layer structure 210 jointly, so as to serve as a mask structure for patterning the material layer 202 in the subsequent process. It should be noticed that the thickness of the patterned photoresist layer 208 can be reduced owing to the use of the tri-layer structure 210 as the mask, thereby enhancing the resolution and preventing the photoresist form collapsing.

Figure 2B:
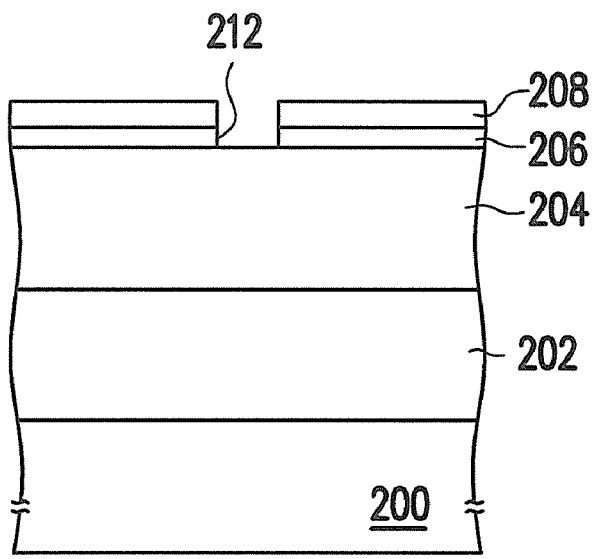

Referring to FIG. 2B, the silicon-containing mask layer 206 is removed using the patterned photoresist layer 208 as a mask, such that the opening pattern 212 can be transferred to the silicon-containing mask layer 206. The removal of the silicon-containing mask layer 206 can be implemented by dry etching, utilizing $CF_4$ and $CHF_3$ as an etching gas, for instant. During the etching of the silicon-containing mask layer 206, the patterned photoresist layer 208 may be etched simultaneously and thus consumed. Hence, when the opening pattern 212 is completely transferred to the silicon-containing mask layer 206, a small part of the patterned photoresist layer 208 may still remain on the silicon-containing mask layer 206, or the patterned photoresist layer 208 may be thoroughly consumed.

Figure 2C:
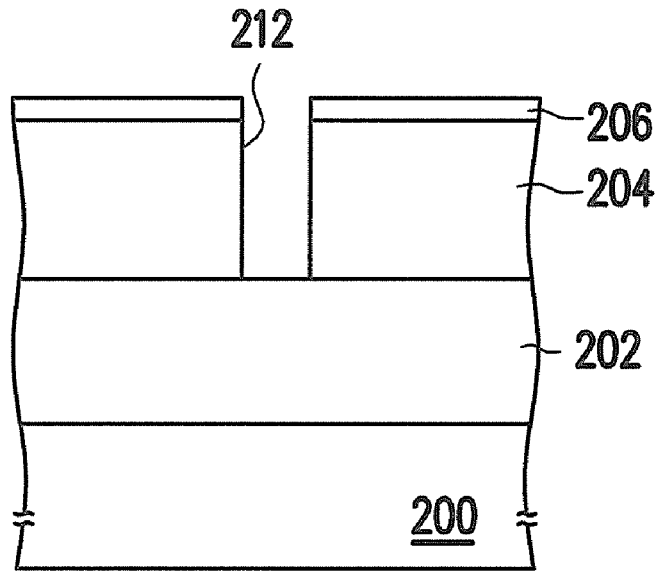

Referring to FIG. 2C, the organic layer 204 is removed using the remaining patterned photoresist layer 208 and the silicon-containing mask layer 206 as a mask, so as to transfer the opening pattern 212 to the organic layer 204. After the organic layer 204 is completely patterned, the patterned photoresist layer 208 on the silicon-containing mask layer 206, for example, has already been consumed thoroughly. The method of removing the organic layer 204 includes using a reactive gas for conducting an etching step, wherein the reactive gas contains no oxygen species. The said etching step is, for example, carried out by a dry etching process.

Specifically, the reactive gas containing no oxygen species may indicate that a molecule of the reactive gas is composed of atoms free from oxygen atoms. That is to say, gas containing oxygen atoms, e.g. CO and $CO_2$, is excluded from the reactive gas. In an embodiment, the foregoing reactive gas includes $N_2$ and $H_2$, wherein a volumetric flow rate ratio of $N_2$ to $H_2$ ranges between 3:1 and 1:1, possibly 1.96:1. In another embodiment, the foregoing reactive gas consists of $N_2$ and $H_2$. In other words, the reactive gas utilized in the etching step merely includes $N_2$ and $H_2$ without other gases. When the reactive gas merely includes $N_2$ and $H_2$, a volumetric flow rate ratio of $N_2$ to $H_2$ ranges between 3:2 and 5:2, possibly 1.96:1.

In practice, using the reactive gas for conducting the etching step so as to remove the organic layer 204 is, for example, implemented under a pressure of about 10 mTorr to 30 mTorr, possibly under a pressure of about 15 mTorr. Radio frequency (RF) power of about 800 W to 1200 W is, for example applied to a top plate, and that of about 200 W to 400 W is applied to a bottom plate for inducing plasma in the etching step, possibly about 800 W to the top plate and about 300 W to the bottom plate. When the reactive gas merely includes $N_2$ and $H_2$, a volumetric flow rate of $N_2$ is, for example, about 150 sccm to 350 sccm, possibly about 265 sccm, while a volumetric flow rate of $H_2$ is, for example, about 50 sccm to 200 sccm, possibly about 135 sccm. Duration of conducting the etching step can ranges between 50 seconds and 150 second, possibly about 85 seconds.

During the etching step, $N_2$ and $H_2$ of the reactive gas are dissociated in the presence of plasma, thereby providing a reactive species. The reactive species can react with a species in the organic layer 204 so as to form products such as $CN_m$ and $NO_n$, as illustrated in the following formula:

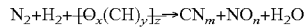

$$N_2 + H_2 + [O_x(CH)_y]_z \rightarrow CN_m + NO_n + H_2O$$

wherein, $[O_x(CH)_y]_z$ represents ingredients of the organic layer 204, and x, y, z, m and n respectively represents a positive integer.

If $N_2$ in the reactive gas functioning as the reactive species may react with the carbon species in the organic layer 204 to form a single bond, C—N bond energy is about 73 kcal/mol. If a double bond is formed therebetween, C=N bond energy is about 147 kcal/mol. If a triple bond is formed therebetween, C≡N bond energy is about 213 kcal/mol. If $N_2$ in the reactive gas may function as the reactive species and react with the oxygen species in the organic layer 204 to form a single bond, N—O bond energy is about 55 kcal/mol. If a double bond is formed therebetween, N=O bond energy is about 143 kcal/mol.

On the contrary, when the organic layer 204 is etched with use of a conventional etching gas containing an oxygen species, the oxygen species may react with the species in the organic layer 204 so as to form products such as CO and $CO_2$, as illustrated in the following formula.

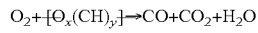

$$O_2 + [O_x(CH)_y] \rightarrow CO + CO_2 + H_2O$$

If $O_2$ in the conventional etching gas functioning as a reactive species may react with the carbon species in the organic layer 204 to form a double bond, C=O bond energy is about 192 kcal/mol. If a triple bond is formed therebetween, C≡O bond energy is about 258 kcal/mol.

Based on the above, when $N_2$ and $H_2$ are utilized as the reactive gas for etching organic layer 204 in an embodiment of the present invention, the reactive species is provided, and a bond energy of a chemical bond formed between the reactive species and the species in the organic layer 204 is weaker than C=O bond energy or C≡O bond energy. In details, the bond energy of the single bond or the double bond formed between the reactive species and the species in the organic layer 204 can be weaker than C=O bond energy, and the bond energy of the triple bond formed between the reactive species and the species in the organic layer 204 can be weaker than C≡O bond energy. That is to say, $N_2$ in the reactive gas react with the carbon or oxygen species in the organic layer 204 thereby forming the chemical bond more easily, as compared with $O_2$ in the conventional etching gas. Accordingly, during the etching of the organic layer 204 with use of the reactive gas, $N_2$ in the reactive gas can react with the carbon or oxygen species in the organic layer 204 to form the chemical bond again, which thus achieves the efficacy like re-deposition.

As shown in FIG. 2C, when the reactive gas without the oxygen species is utilized for conducting an etching step to the organic layer 204 so as to transfer the opening pattern 212 to the organic layer 204, the chemical bond in the organic layer 204 can be broken by radical form $H_2$ in the reactive gas, thereby achieving the efficacy of etching. In the meantime, $N_2$ in the reactive gas can perform the re-deposition process. During the etching step, an over-etched profile in the organic layer 204 may be compensated by the said re-deposition, and the side-etching rate can be well controlled. Hence, the opening pattern 212 transferred into the organic layer 204 can be free from the formation of excessively large top CD or bowing profile efficaciously. As a result, the opening pattern 212 transferred into the organic layer 204 can be formed in a smoother profile, and the predetermined shape and CD of the patterns can be maintained as desired.

Figure 2D:
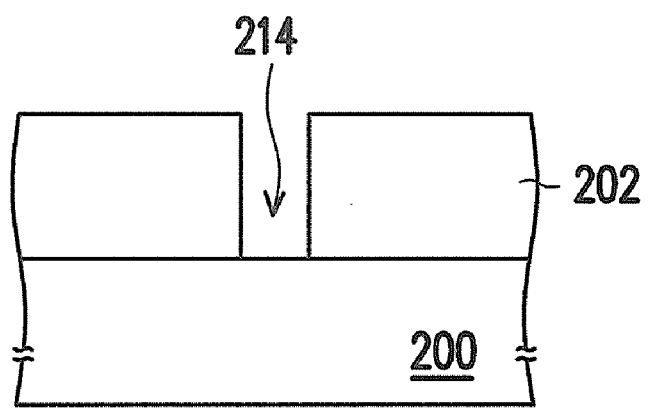

Referring to FIG. 2D, the material layer 202 is removed using the silicon-containing mask layer 206 and the organic layer 204 as a mask, so as to transfer the opening pattern 212 to the material layer 202 and form an opening 214 in the material layer 202. The opening 214 can be a dual damascene opening, a contact hole, a via hole or a conductive line opening. The method for removing the material layer 202 is, for example, a dry etching process, and the etching gas thereof varies according to the material layer 202 to be etched. During the opening pattern 212 is transferred to the material layer 202, given that the silicon-containing mask layer 206 has been consumed thoroughly, the organic layer 204 can be adopted as an etching mask to perform the etching process continuously until the opening pattern 212 is completely transferred to the material layer 202. After the formation of the opening 214, the residual organic layer 204 is removed. The method of removing the organic layer 204 can be a dry stripping process or a wet stripping process.

It is noted that the organic layer 204 is etched using the reactive gas without containing the oxygen species so as to transfer the opening pattern 212 to the organic layer 204, and the opening pattern 212 transferred into the organic layer 204 can thus have the smoother profile and the predetermined CD. Accordingly, the predetermined shape and CD of the opening 214 formed in the material layer 202 can be maintained as desired with the use of the organic layer 204 as the etching mask, thereby preventing the bridging issue of the successively-formed devices in the opening 214.

Moreover, the above-mentioned patterning method can be mainly applied to the back end of line. In the field of fabrication of a dual damascene opening, a practical application of the patterning method according to this invention is provided hereinafter. It is to be understood that the following procedures are intended to explain formation of a mask for defining the opening pattern in the dual damascene process based on the practical patterning method and thereby enable those of ordinary skill in the art to practice this invention, but are not construed as limiting the scope of this invention. It is appreciated by those of ordinary skill in the art that other elements, such as the substrate, the plug, the conductive line, the opening or the conductive region, can be arranged and formed in a manner or in an amount not shown in the illustrated embodiment according to known knowledge in the art. FIGS. 3A-3F depict, in a cross-sectional view, a method for fabricating a dual damascene opening according to an embodiment of the present invention.

Figure 3A:
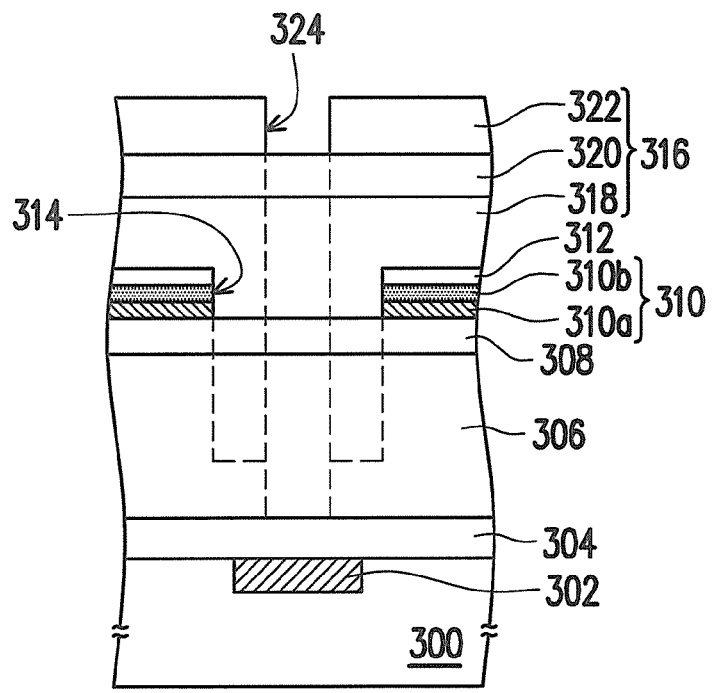
FIGS. 3A-3F depict, in a cross-sectional view, a method for fabricating a dual damascene opening according to an embodiment of the present invention.

Referring to FIG. 3A, a substrate 300 with a conductive region 302 is provided, and the conductive region 302 is covered by a liner 304. The substrate 300 can be a semiconductor substrate, such as an N- or P-type silicon substrate, a Group III or V semiconductor substrate and so on. The conductive region 302 is, for example, a metal conductive line in the interconnection process, e.g. a copper conductive line. The liner 304 covering the conductive region 302 can prevent the conductive region 302 from being oxidizing. The material of the liner 304 can be nitrogen-doped carbide (SiCN), silicon oxide or silicon nitride, and the thickness thereof is, for example, about 150 Å to 350 Å, possibly about 250 Å.

Afterwards, a dielectric layer 306, a buffer layer 308, a patterned hard mask layer 310 and a cap layer 312 are formed on the liner 304 in sequence. The material of the dielectric layer 306 can be an ultra low-k (ULK) material that usually may be a dielectric material with a dielectric constant about 2.5 or even lower. The thickness of the dielectric layer 306 is, for example, about 1250 Å to 2250 Å, possibly about 1750 Å. The material of the buffer layer 308 can be a dielectric material different form that of the dielectric layer 306, e.g. silicon oxynitride or silicon oxide, possibly silicon oxynitride. The thickness of the buffer layer 308 is, for example, about 50 Å to 250 Å, possibly about 150 Å. The patterned hard mask layer 310 has an opening 314 that exposes the buffer layer 308, and the opening 314 can have a trench pattern to be formed in the dielectric layer 306. The material of the patterned hard mask layer 310 includes metal or nitride thereof, such as Ti, TiN, Ta, TaN, W, WN or their combination. In this embodiment, the patterned hard mask layer 310 includes a Ti layer 310a and a TiN layer 310b stacked in a bottom-up manner, wherein the thickness of the Ti layer 310a and the TiN layer 310b can be respectively about 25 Å to 75 Å, possibly about 50 Å. The cap layer 312 covers the patterned hard mask layer 310, so as to protect the patterned hard mask layer 310. The material of the cap layer 312 can be silicon oxide, silicon oxynitride, silicon nitride or silicon carbide, possibly silicon oxide. The thickness of the cap layer 312 is, for example, about 50 Å to 250 Å, possibly about 150 Å.

Thereafter, a tri-layer structure 316 is formed on the cap layer 312, and the tri-layer structure 316 fills the opening 314. In an embodiment, the tri-layer structure 316 includes an organic layer 318, a silicon-containing mask layer 320 and a patterned photoresist layer 322 stacked in a bottom-up manner. In particular, the material of the organic layer 318, for example, includes I-line photoresist with a wavelength of 365 nm or the like. The thickness of the organic layer 318 is, for example, about 1000 Å to 3000 Å, possibly about 2000 Å. The silicon-containing mask layer 320 may be a silicon-containing hard-mask bottom anti-reflection coating (SHB). The thickness of the silicon-containing mask layer 320 is, for example, about 300 Å to 700 Å, possibly about 500 Å. The patterned photoresist layer 322, for example, has an opening 324 that exposes the silicon-containing mask layer 320, and the opening 324 can have a via hole pattern to be formed in the dielectric layer 306. The material of the patterned photoresist layer 322 can be ArF photoresist with a wavelength of 193 nm. The thickness of the patterned photoresist layer 322 is, for example, about 800 Å to 1500 Å, possibly about 1100 Å.

Figure 3B:
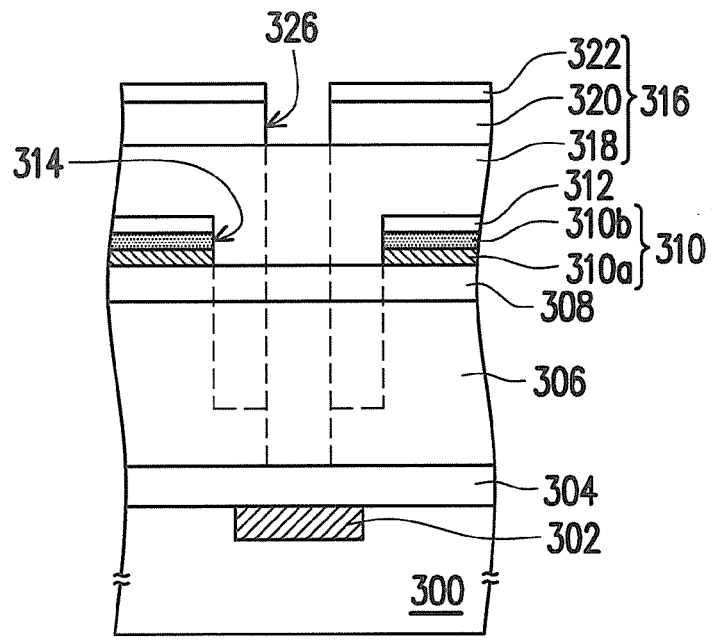

Referring to FIG. 3B, the silicon-containing mask layer 320 is removed using the patterned photoresist layer 322 as a mask to transfer the pattern of the opening 324 to the silicon-containing mask layer 320, so that an opening 326 exposing the organic layer 318 is formed in the silicon-containing mask layer 320. The removal of the silicon-containing mask layer 320 can be implemented by a dry etching process, utilizing $CF_4$ and $CHF_3$ as an etching gas, for instant. After the formation of the opening 326, a small part of the patterned photoresist layer 322 may still remain on the silicon-containing mask layer 320, or the patterned photoresist layer 322 can be thoroughly consumed.

Figure 3C:
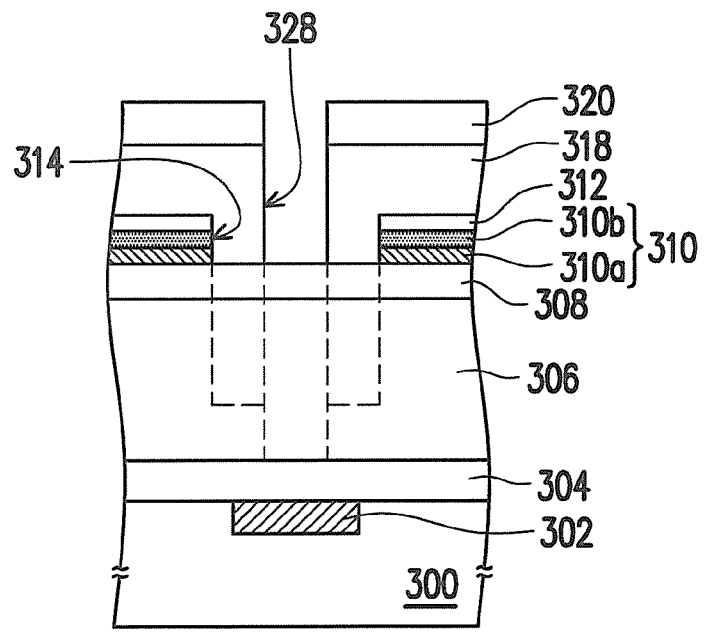

Referring to FIG. 3C, the organic layer 318 is removed using the remaining patterned photoresist layer 322 and the silicon-containing mask layer 320 as a mask, so as to form an opening 328 exposing the buffer layer 308 in the organic layer 318. The method of removing organic layer 318 includes using a reactive gas for conducting an etching step, e.g. a dry etching process, wherein the reactive gas contains no oxygen species. Besides, during the said etching step, the reactive gas can provide a reactive species, and a bond energy of a chemical bond formed between the reactive species and the species in the organic layer 318 is, for example, weaker than C=O bond energy or C≡O bond energy.

Specifically, the reactive gas containing no oxygen species may indicate that a molecule of the reactive gas is composed of atoms free from oxygen atoms. Accordingly, gas containing oxygen atoms, e.g. CO and $CO_2$, is excluded from the reactive gas. In an embodiment, the foregoing reactive gas may include $N_2$ and $H_2$. In another embodiment, the foregoing reactive gas may consist of $N_2$ and $H_2$ without other gases containing therein. The etching step using the reactive gas to remove organic layer 318 is, for example, implemented under a pressure of about 10 mTorr to 30 mTorr, possibly under a pressure of about 15 mTorr. Radio frequency (RF) power of about 800 W to 1200 W is, for example applied to a top plate, and that of about 200 W to 400 W is applied to a bottom plate for inducing plasma in the etching step, possibly about 800 W to the top plate and about 300 W to the bottom plate. When the reactive gas merely includes $N_2$ and $H_2$, a volumetric flow rate of $N_2$ is, for example, about 150 sccm to 350 sccm, possibly about 265 sccm, while a volumetric flow rate of $H_2$ is, for example, about 50 sccm to 200 sccm, possibly about 135 sccm. Duration of conducting the etching step can ranges between 50 seconds and 150 second, possibly about 85 seconds.

In an embodiment of the present invention, the reactive gas utilized contains no oxygen species, and the bond energy of the chemical bond formed between the reactive species and the species in the organic layer 318 is lower. Accordingly, the re-deposition reaction can be performed by $N_2$ in the reactive gas, which is simultaneous with the etching reaction, and the etching rate can thus be controlled. As a result, the opening 328 in the organic layer 318 can be prevented from forming excessively large top CD, and the issue regarding bowing profile of the opening 328 invoked by over side etching can also be improved, such that the opening 328 can have a smoother profile.

Figure 3D:
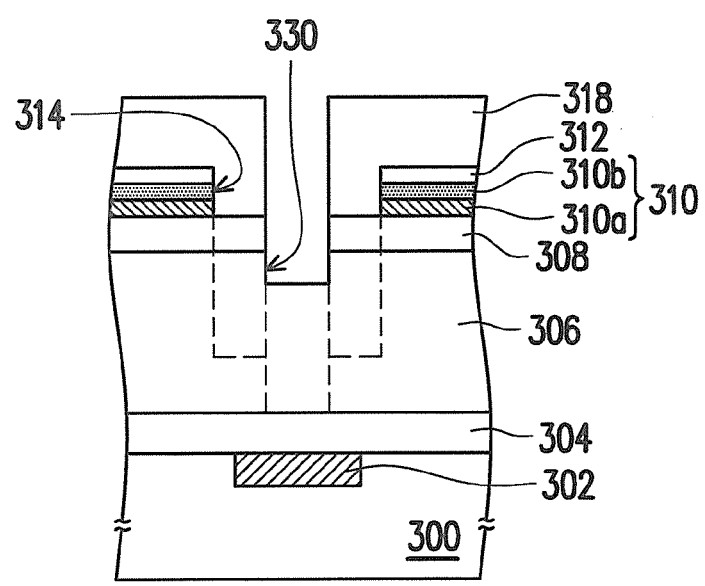

Referring to FIG. 3D, the buffer layer 308 and a portion of the dielectric layer 306 are then removed using the silicon-containing mask layer 320 and organic layer 318 as a mask, so as to form an opening 330 in the dielectric layer 306. The method for removing the buffer layer 308 and the partial dielectric layer 306 can be a dry etching process using $C_4F_8$ and $CF_4$ as an etching gas, for example. In addition, during the etching of the buffer layer 308 and the partial dielectric layer 306, the silicon-containing mask layer 320 may be etched simultaneously and thus depleted. In an embodiment, the depth of the opening 330 formed in the dielectric layer 306 is, for example, at a distance of about 400 Å to 500 Å from the upper surface of the dielectric layer 306.

Figure 3E:
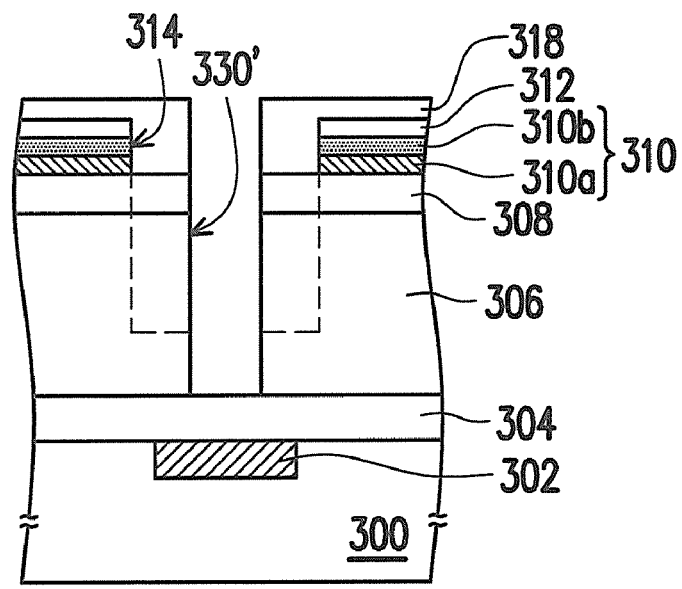

Referring to FIG. 3E, the dielectric layer 30 is removed successively using the remaining silicon-containing mask layer 320 and the organic layer 318 as a mask, so that an opening 330' exposing the liner 304 is formed in the dielectric layer 306. The opening 330', for example, functions as a via hole. The method of removing the dielectric layer 306 can be implemented by a dry etching process using $C_4F_8$ as an etching gas, for example. Likewise, during the etching of the dielectric layer 306 for deepening the via hole, the silicon-containing mask layer 320 may be consumed thoroughly, and a portion of the organic layer 318 may also be consumed through etching.

Figure 3F:
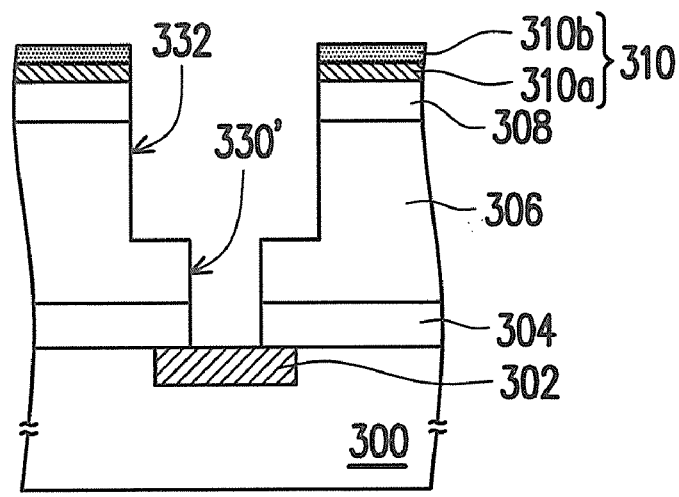

Referring to FIG. 3F, after the formation of the opening 330', the residual organic layer 318 is removed, so that the patterned hard mask layer 310 is exposed. The method of removing the organic layer 318 can be a dry stripping process or a wet stripping process. In an embodiment, the organic layer 318 can be removed through ashing process using $CO_2$ as a reactive gas. Afterwards, the buffer layer 308 and a portion of the dielectric layer 306 are removed using the patterned hard mask layer 310 as a mask, so that an opening 332 is formed in the dielectric layer 306 and then the liner 304 exposed by the opening 330' is removed as well. The conductive region 302 can thus be exposed. The opening 332, for example, functions as a trench, wherein the opening 332 is connected with the opening 330' so as to constitute a dual damascene opening. In this step, the removal of the buffer layer 308 the partial dielectric layer 306 can be carried out by a dry etching process using $C_4F_8$ and $CF_4$ as an etching gas.

After accomplishing the fabrication of the dual damascene opening, the patterned hard mask layer 310 can be further removed, and the dual damascene opening can be filled with a conductive layer, so as to form a dual damascene structure electrically connecting to the conductive region 302. The method for forming the said structures is well appreciated by persons skilled in the art, and thus, the detailed descriptions thereof are not described herein.

In view of the above, the patterning method and the method for fabricating the dual damascene opening have at least the following advantages.

1. The patterning method and the method for fabricating the dual damascene opening in the embodiments aforementioned utilize the reactive gas without the oxygen species or, in the alternative, the reactive gas capable of forming a chemical bond with less bond energy between the reactive species and the species in the organic layer. Accordingly, the re-deposition reaction can be performed simultaneously with the etching reaction, so as to well control the etching rate.

2. The patterning method and the method for fabricating the dual damascene opening in the embodiments aforementioned can fabricate the organic layer having patterns with the smoother profile and the predetermined CD. Hence, the accuracy of pattern transferring not only can be guaranteed by means of the said organic layer as an etching mask for forming an opening, but the resultant opening can have reduced top CD and improved profile.

3. The patterning method and the method for fabricating the dual damascene opening in the embodiments aforementioned can be widely applied in the formation of various openings, especially in the back end of line, and can be integrated with the existing semiconductor process. The process is not only simple, but can also improve the reliability and yield of the device effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a dual damascene opening, comprising:
    providing a substrate having at least one conductive region covered by a liner;
    forming a dielectric layer and a patterned metal hard mask layer on the liner in sequence, wherein the patterned metal hard mask layer has an opening exposing the dielectric layer;
    forming a tri-layer structure filling the opening on the patterned metal hard mask layer, wherein the tri-layer structure comprises an organic layer, a silicon-containing mask layer and a patterned photoresist layer stacked in a bottom-up manner;
    removing the silicon-containing mask layer using the patterned photoresist layer as a mask;
    using a reactive gas for conducting an etching step so as to remove the organic layer with the silicon-containing mask layer as a mask, wherein the reactive gas contains no oxygen species;
    removing the dielectric layer using the silicon-containing mask layer and the organic layer as a mask, so that a via hole exposing the liner is formed in the dielectric layer;
    removing the organic layer; and
    removing the dielectric layer using the patterned metal hard mask layer as a mask to form a trench in the dielectric layer, and removing the liner exposed by the via hole to expose the conductive region, wherein the trench is connected with the via hole.

2. The method according to claim 1, wherein the reactive gas comprises $N_2$ and $H_2$.

3. The method according to claim 1, wherein the reactive gas consists of $N_2$ and $H_2$.

4. The method according to claim 3, wherein a volumetric flow rate ratio of $N_2$ to $H_2$ ranges between 3:1 and 1:1.

5. The method according to claim 1, wherein a duration of the etching step ranges between 50 seconds and 150 seconds.

6. The method according to claim 1, wherein the organic layer comprises I-line photoresist.

7. The method according to claim 1, wherein a buffer layer is disposed under the patterned metal hard mask layer.

8. The method according to claim 1, wherein a cap layer is disposed on the patterned metal hard mask layer and covers the patterned metal hard mask layer.

9. The method according to claim 1, wherein the dielectric layer is a single layer.

10. The method according to claim 1, wherein the silicon-containing mask layer is removed without removing the patterned photoresist layer.

* * * * *